(12) United States Patent
Kusunoki et al.

(10) Patent No.: US 9,902,856 B2
(45) Date of Patent: Feb. 27, 2018

(54) ADDITION/CONDENSATION CURABLE SILICONE RESIN SHEET, WAVELENGTH CONVERSION SHEET, AND MANUFACTURE OF LIGHT-EMITTING PACKAGE

(71) Applicant: Shin-Etsu Chemical Co., Ltd., Tokyo (JP)

(72) Inventors: Takayuki Kusunoki, Annaka (JP); Yuusuke Takamizawa, Annaka (JP); Yoshihira Hamamoto, Annaka (JP); Kinya Kodama, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 5 days.

(21) Appl. No.: 15/294,006

(22) Filed: Oct. 14, 2016

(65) Prior Publication Data
US 2017/0114220 A1    Apr. 27, 2017

(30) Foreign Application Priority Data
Oct. 22, 2015   (JP) .................. 2015-207806

(51) Int. Cl.
C08L 83/06 (2006.01)
C08J 5/18 (2006.01)
H01L 33/50 (2010.01)
H01L 33/54 (2010.01)
C09D 183/08 (2006.01)
H01L 33/56 (2010.01)

(52) U.S. Cl.
CPC .............. C08L 83/06 (2013.01); C08J 5/18 (2013.01); C09D 183/08 (2013.01); H01L 33/502 (2013.01); H01L 33/507 (2013.01); H01L 33/54 (2013.01); H01L 33/56 (2013.01); C08J 2383/04 (2013.01); C08J 2483/06 (2013.01); C08J 2483/07 (2013.01); C08L 2205/02 (2013.01); C08L 2205/03 (2013.01); H01L 2933/005 (2013.01); H01L 2933/0041 (2013.01)

(58) Field of Classification Search
CPC ................... C08G 77/12; C08G 77/20
See application file for complete search history.

(56) References Cited

U.S. PATENT DOCUMENTS 5,504,174 A *   4/1996   Onishi ................. C08L 83/04
                                                    525/478
7,019,100 B2    3/2006   Tabei et al.
7,858,198 B2   12/2010   Kashiwagi et al.
2014/0088281 A1 3/2014   Ko et al.

FOREIGN PATENT DOCUMENTS

| EP | 1 980 591 A1 | 10/2008 |
| EP | 2508569 A1 | 10/2012 |
| EP | 2733178 A1 | 5/2014 |
| JP | 2004-339482 A | 12/2004 |
| JP | 2005-524737 A | 8/2005 |
| JP | 4927019 B2 | 5/2012 |
| WO | WO 03/093393 A1 | 11/2003 |

OTHER PUBLICATIONS

Extended European Search Report dated Mar. 8, 2017, for European Application No. 16192980.7.

* cited by examiner

Primary Examiner — Kuo Liang Peng
(74) Attorney, Agent, or Firm — Birch, Stewart, Kolasch & Birch, LLP

(57) ABSTRACT

An addition/condensation curable silicone resin sheet comprising (A) an organopolysiloxane containing at least two silicon-bonded alkenyl groups and at least two silicon-bonded alkoxy or hydroxyl groups, (B) an organopolysiloxane containing at least two silicon-bonded hydrogen atoms and at least two silicon-bonded alkoxy or hydroxyl groups, (C) an organopolysiloxane containing at least two silicon atoms having two alkoxy or hydroxyl groups and one hydrogen atom on a common silicon atom, and (D) a hydrosilylation catalyst is plastic and solid or semisolid at normal temperature. The silicone resin sheet is easy to work, effective to cure, and likely to form a cured layer around an LED chip.

6 Claims, No Drawings

ADDITION/CONDENSATION CURABLE SILICONE RESIN SHEET, WAVELENGTH CONVERSION SHEET, AND MANUFACTURE OF LIGHT-EMITTING PACKAGE

CROSS-REFERENCE TO RELATED APPLICATION

This non-provisional application claims priority under 35 U.S.C. § 119(a) on Patent Application No. 2015-207806 filed in Japan on Oct. 22, 2015, the entire contents of which are hereby incorporated by reference.

TECHNICAL FIELD

This invention relates to an addition/condensation curable silicone resin sheet, wavelength conversion sheet, and method for manufacturing a light-emitting package using the sheet.

BACKGROUND ART

In the field of light-emitting diodes (LED), it is well known to use phosphors for wavelength conversion (Patent Document 1: JP-A 2005-524737). On the other hand, as the coating material for encapsulating and protecting LED chips, silicone resins are regarded attractive because of their light resistance (Patent Document 2: JP-A 2004-339482).

White LEDs are generally constructed by coating a blue-emitting LED chip with a silicone or epoxy resin compound having a phosphor dispersed therein so that the phosphor is distributed in proximity to the chip for converting blue light to pseudo-white light.

However, if the distribution of the phosphor within the resin layer is non-uniform or graded, then a color shift is likely to occur. The phosphor must be uniformly dispersed within the resin layer before uniform white light can be produced. In order to achieve such uniform dispersion, studies are made on screen printing and phosphor dispersion via precipitation. These methods still have some problems including complex production steps and inadequate stability. Accordingly, a simple technique capable of uniformly dispersing a phosphor over a chip surface is sought after. In this context, Patent Document 3 (JP 4927019) proposes to encapsulate LED chips with a normally solid or semisolid, addition curable silicone resin having a phosphor uniformly dispersed therein.

As advanced LEDs become of higher power, the resin layer for coating the LED chip is required to have better heat resistance and UV resistance. Even the addition curable silicone resin of Patent Document 3 fails to clear the level of heat resistance and UV resistance. This is because hydrosilylation catalysts such as platinum complexes, palladium complexes and rhodium complexes are not only essential for addition curable silicone resins to cure, but also act to accelerate degradation of the resins. It is thus necessary to minimize the amount of the hydrosilylation catalyst while maintaining a cure rate so as to avoid any drop of working efficiency and productivity.

As the means for minimizing the amount of the hydrosilylation catalyst while maintaining curability, a combination of addition cure and condensation cure is contemplated effective. For the condensation cure that generally proceeds at a slow cure rate, condensation catalysts must be used. However, these condensation catalysts also cause to degrade the silicone resins, giving rise to the problem that the resins lose heat resistance and light resistance. Some catalysts themselves are colored, or the resins are colored due to degradation. Many catalysts are inadequate in the application where transparency is important.

CITATION LIST

Patent Document 1: JP-A 2005-524737 (WO 03/093393)
Patent Document 2: JP-A 2004-339482
Patent Document 3: JP 4927019 (U.S. Pat. No. 7,858,198, EP 1980591)

DISCLOSURE OF INVENTION

An object of the invention is to provide an addition/condensation curable silicone resin sheet which remains uncured even at normal temperature, is easy to handle, is fully curable, and has high heat resistance and UV resistance; a wavelength conversion sheet in which a phosphor is uniformly dispersed and its dispersion is stable with a lapse of time; and a method for manufacturing a light-emitting package.

As mentioned above, there is a need for a curable silicone resin sheet which is easy to handle and rapidly cures into a cured sheet having high heat resistance and light resistance.

The inventors have found that when an addition cure mode by coaction of alkenyl groups and hydrosilyl groups is combined with a condensation cure mode based on an organopolysiloxane containing at least two silicon atoms having two alkoxy or hydroxyl groups and one hydrogen atom on a common silicon atom in the molecule, there is obtained a normally solid or semisolid, addition/condensation curable silicone resin sheet which maintains fast cure and exhibits high heat resistance and light resistance.

In one aspect, the invention provides an addition/condensation curable silicone resin sheet comprising the following components (A) to (D):

(A) an organopolysiloxane containing at least two silicon-bonded alkenyl groups and at least two silicon-bonded alkoxy or hydroxyl groups in the molecule, represented by the formula (1):

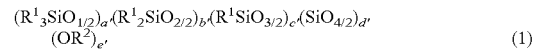
$$(R^1{}_3SiO_{1/2})_{a'}(R^1{}_2SiO_{2/2})_{b'}(R^1SiO_{3/2})_{c'}(SiO_{4/2})_{d'}(OR^2)_{e'} \quad (1)$$

wherein $R^1$ is a $C_1$-$C_6$ monovalent aliphatic saturated hydrocarbon group, $C_2$-$C_6$ alkenyl group or $C_6$-$C_{12}$ monovalent aromatic hydrocarbon group, at least two $R^1$ being alkenyl, $R^2$ is hydrogen or $C_1$-$C_6$ alkyl or alkoxyalkyl group, a', b', c', and d' each are an integer of at least 0, c'+d' is an integer of at least 1, and e' is an integer of at least 2, the organopolysiloxane (A) being solid or semisolid at normal temperature and having a Mw of 1,000 to 1,200,000 as measured versus polystyrene standards by PGC, (B) an organopolysiloxane containing at least two silicon-bonded hydrogen atoms and at least two silicon-bonded alkoxy or hydroxyl groups in the molecule, represented by the formula (2):

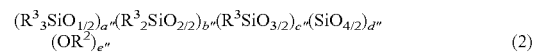
$$(R^3{}_3SiO_{1/2})_{a''}(R^3{}_2SiO_{2/2})_{b''}(R^3SiO_{3/2})_{c''}(SiO_{4/2})_{d''}(OR^2)_{e''} \quad (2)$$

wherein $R^3$ is hydrogen, a $C_1$-$C_6$ monovalent aliphatic saturated hydrocarbon group, or $C_6$-$C_{12}$ monovalent aromatic hydrocarbon group, at least two $R^3$ being hydrogen, $R^2$ is as defined above, a'', b'', c'', and d'' each are an integer of at least 0, c''+d'' is an integer of at least 1, and e'' is an integer of at least 2, the organopolysiloxane (B) being solid or semisolid at normal temperature and having a Mw of 1,000 to 1,200,000 as measured versus polystyrene standards by GPC, in an amount to give a ratio of the number of silicon-bonded hydrogen atoms to the total number of alkenyl groups in component (A) in a range of 0.4/1 to 4.0/1, (C) an organopolysiloxane containing at least two silicon atoms having two alkoxy or hydroxyl groups and one hydrogen atom on a common silicon atom in the molecule, represented by the formula (3):

$$(R^3{}_3SiO_{1/2})_{a'''}(R^3{}_2SiO_{2/2})_{b'''}(R^3SiO_{3/2})_{c'''}(SiO_{4/2})_{d'''} \\ (OR^2)_{e'''}(HSi(OR^2)_2O_{1/2})_f \qquad (3)$$

wherein $R^2$ and $R^3$ are as defined above, a''', b''', c''', d''' and e''' each are an integer of at least 0, and f is an integer of at least 2, the organopolysiloxane (C) having a Mw of 150 to 10,000 as measured versus polystyrene standards by GPC, in an amount of 0.1 to 20 parts by weight per 100 parts by weight of components (A) and (B) combined, and (D) a catalytic amount, specifically 0.5 to 10 ppm based on the total weight of components (A), (B) and (C), of a hydrosilylation catalyst. The sheet is plastic and solid or semisolid at normal temperature.

The addition/condensation curable silicone resin sheet comprising the organopolysiloxanes (A) to (C) defined above cures rapidly into a cured sheet having high heat resistance and light resistance. The addition/condensation curable silicone resin sheet remains fully curable even though the amount of the hydrosilylation catalyst is minimized. The cured sheet contains only a minimal amount of the hydrosilylation catalyst, but not a condensation catalyst. This prevents the resin from being colored and degraded by the catalyst, allowing the sheet to exhibit heat resistance and light resistance.

Once a phosphor is added to the addition/condensation curable silicone resin sheet, the sheet serves as a wavelength conversion sheet for LED. A light-emitting package may be manufactured by placing the silicone resin sheet or wavelength conversion sheet on the surface of an LED chip, and heat curing the sheet to encapsulate the LED chip surface with the cured silicone resin layer. A light-emitting package comprising the thus encapsulated LED chip is also contemplated.

Advantageous Effects of Invention

The silicone resin sheet of the invention is easy to work, effective to cure, and likely to form a cured layer around an LED chip. The cured layer attracts no dust deposits and is easy to handle due to a lack of surface tack, and exhibits heat resistance, light resistance, optical transparency, toughness and adhesion. The sheet is best suited for the encapsulation of LED chips.

DESCRIPTION OF PREFERRED EMBODIMENTS

Since the silicone resin sheet is formed of an addition/condensation curable silicone resin composition, reference is made to sheet or composition as the case may be. As used herein, the term "normal temperature" (sometimes normally) indicates a temperature of 24±2° C., i.e., 22 to 26° C. A weight average molecular weight (Mw) is measured versus polystyrene standards by gel permeation chromatography (GPC) under the following conditions.

GPC Analysis Conditions

| Developing solvent: | tetrahydrofuran (THF) |
|---|---|
| Flow rate: | 0.3 mL/min |
| Column: | TSK Guardcolumn SuperH-L TSKgel SuperMultiporeHZ (6.0 mm ID × 15 cm × 4) (all Tosoh Corp.) |
| Column temperature: | 40° C. |
| Sample injection volume: | 20 μL (sample concentration: 0.5 wt % THF solution) |
| Detector: | differential refractive index (RI) detector |

Component (A)

Component (A), which is a main component in the inventive composition, is a normally solid or semisolid organopolysiloxane having alkenyl groups capable of addition reaction and alkoxy or hydroxyl groups capable of condensation reaction. Specifically, it is an organopolysiloxane containing at least two silicon-bonded alkenyl groups and at least two silicon-bonded alkoxy or hydroxyl groups in the molecule, represented by the formula (1).

$$(R^1{}_3SiO_{1/2})_{a'}(R^1{}_2SiO_{2/2})_{b'}(R^1SiO_{3/2})_{c'}(SiO_{4/2})_{d'} \\ (OR^2)_{e'} \qquad (1)$$

Herein $R^1$ is a $C_1$-$C_6$ monovalent aliphatic saturated hydrocarbon group, $C_2$-$C_6$ alkenyl group or $C_6$-$C_{12}$ monovalent aromatic hydrocarbon group, at least two $R^1$ being alkenyl, $R^2$ is hydrogen or $C_1$-$C_6$ alkyl or alkoxyalkyl group, a', b', c', and d' each are an integer of at least 0, c'+d' is an integer of at least 1, and e' is an integer of at least 2. The organopolysiloxane (A) should have a Mw of 1,000 to 1,200,000, preferably 5,000 to 1,100,000, and more preferably 10,000 to 1,000,000.

Examples of $R^1$ include alkyl groups such as methyl, ethyl, propyl, butyl and hexyl; cycloalkyl groups such as cyclopentyl and cyclohexyl; alkenyl groups such as vinyl, allyl and hexenyl; aryl groups such as phenyl, tolyl and naphthyl; aralkyl groups such as benzyl, phenylethyl and phenylpropyl; and substituted forms of the foregoing in which at least one carbon-bonded hydrogen (one or more or even all hydrogen atoms) is substituted by halogen (e.g., fluorine, bromine, chlorine), cyano, (meth)acryloxy, glycidyloxy, mercapto or amino, for example, halogenated monovalent hydrocarbon groups such as trifluoropropyl and chloropropyl, cyanoalkyl groups such as α-cyanoethyl and γ-cyanopropyl, as well as 3-methacryloxypropyl, 3-glycidyloxypropyl, 3-mercaptopropyl, and 3-aminopropyl. Of these, methyl and phenyl are preferred as $R^1$.

Examples of $R^2$ include hydrogen; alkyl groups such as methyl, ethyl, propyl, isopropyl, butyl and octyl; and alkoxyalkyl groups such as methoxymethyl, methoxyethyl, and ethoxymethyl, with hydrogen, methyl and ethyl being preferred.

The preferred range of a', b', c', d' and e' is as follows: a' is an integer of 0 to 12,000, more preferably 0 to 6,000; b' is an integer of 10 to 14,000, more preferably 100 to 12,000; c' is an integer of 10 to 12,000, more preferably 100 to 9,000; d' is an integer of 0 to 12,000, more preferably 0 to 9,000; e' is an integer of 2 to 3,000, more preferably 2 to 1,000; 20≤c'+d'≤24,000, more preferably 50≤c'+d'≤18,000.

The number of alkenyl groups per molecule is at least 2, preferably 3 to 3,000, and more preferably 5 to 1,500. The vinyl value is preferably 0.01 to 0.3 mol/100 g, more preferably 0.03 to 0.2 mol/100 g.

The organopolysiloxane (A) as defined above may be synthesized by any well-known methods, for example, by hydrolytic condensation of halogenated silanes or alkoxysilanes although commercially available ones may be used.

Component (B)

Component (B), which serves as a crosslinker, is an organopolysiloxane containing hydrosilyl groups capable of addition reaction and alkoxy or hydroxyl groups capable of condensation reaction. Specifically, it is a normally solid or semisolid organopolysiloxane containing at least two silicon-bonded hydrogen atoms and at least two silicon-bonded alkoxy or hydroxyl groups in the molecule, represented by the formula (2).

$$(R^3_3SiO_{1/2})_{a''}(R^3_2SiO_{2/2})_{b''}(R^3SiO_{3/2})_{c''}(SiO_{4/2})_{d''}(OR^2)_{e''} \quad (2)$$

Herein $R^3$ is hydrogen, a $C_1$-$C_6$ monovalent aliphatic saturated hydrocarbon group, or $C_6$-$C_{12}$ monovalent aromatic hydrocarbon group, at least two $R^3$ being hydrogen, $R^2$ is as defined above, a″, b″, c″, and d″ each are an integer of at least 0, c″+d″ is an integer of at least 1, and e″ is an integer of at least 2. The organopolysiloxane (B) should have a Mw of 1,000 to 1,200,000, preferably 5,000 to 1,100,000, and more preferably 10,000 to 1,000,000.

Examples of $R^3$ include hydrogen; alkyl groups such as methyl, ethyl, propyl, butyl and hexyl; cycloalkyl groups such as cyclopentyl and cyclohexyl; aryl groups such as phenyl, tolyl and naphthyl; aralkyl groups such as benzyl, phenylethyl and phenylpropyl; and substituted forms of the foregoing in which at least one carbon-bonded hydrogen (one or more or even all hydrogen atoms) is substituted by halogen (e.g., fluorine, bromine, chlorine), cyano, (meth)acryloxy, glycidyloxy, mercapto or amino, for example, halogenated monovalent hydrocarbon groups such as trifluoropropyl and chloropropyl, cyanoalkyl groups such as β-cyanoethyl and γ-cyanopropyl, as well as 3-methacryloxypropyl, 3-glycidyloxypropyl, 3-mercaptopropyl, and 3-aminopropyl. Of these, methyl and phenyl are preferred as $R^3$.

The preferred range of a″, b″, C″, d″ and e″ is as follows: a″ is an integer of 0 to 12,000, more preferably 0 to 6,000; b″ is an integer of 10 to 14,000, more preferably 100 to 12,000; c″ is an integer of 10 to 12,000, more preferably 100 to 9,000; d″ is an integer of 0 to 12,000, more preferably 0 to 9,000; e″ is an integer of 2 to 3,000, more preferably 2 to 1,000; 20≤c″+d″≤24,000, more preferably 50≤c″+d″≤18,000.

The number of SiH groups per molecule is at least 2, preferably 3 to 3,000, and more preferably 5 to 1,500. The H value (SiH value) is preferably 0.01 to 0.3 mol/100 g, more preferably 0.03 to 0.2 mol/100 g.

The organopolysiloxane (B) as defined above may be synthesized by any well-known methods, for example, by hydrolytic condensation of halogenated silanes or alkoxysilanes although commercially available ones may be used.

Component (B) is blended with component (A) in such amounts that a ratio of the number of silicon-bonded hydrogen atoms in component (B) to the total number of alkenyl groups in component (A) may range from 0.4/1 to 4.0/1, preferably from 0.6/1 to 3.0/1, and more preferably from 0.8/1 to 2.0/1. As long as components (A) and (B) are combined in the range, a satisfactory cured product is obtainable.

Component (C)

Component (C) is an organopolysiloxane containing at least two silicon atoms having two alkoxy or hydroxyl groups and one hydrogen atom on a common silicon atom in the molecule, represented by the formula (3).

$$(R^3_3SiO_{1/2})_{a'''}(R^3_2SiO_{2/2})_{b'''}(R^3SiO_{3/2})_{c'''}(SiO_{4/2})_{d'''}(OR^2)_{e'''}(HSi(OR^2)_2O_{1/2})_{f} \quad (3)$$

Herein $R^2$ and $R^3$ are as defined above, a‴, b‴, c‴, d‴ and e‴ each are an integer of at least 0, and f is an integer of at least 2. The organopolysiloxane (C) should have a Mw of 150 to 10,000, preferably 200 to 9,000, and more preferably 300 to 8,000.

The preferred range of a‴, b‴, c‴, d‴, e‴ and f is as follows: a‴ is an integer of 0 to 50, more preferably 0 to 30; b‴ is an integer of 0 to 100, more preferably 1 to 60; c‴ is an integer of 0 to 75, more preferably 0 to 50; d‴ is an integer of 0 to 75, more preferably 0 to 50; e‴ is an integer of 0 to 20, more preferably 0 to 10; and f is an integer of 2 to 20, more preferably 2 to 15.

Component (C) is used in an amount of 0.1 to 20 parts by weight, preferably 0.5 to 15 parts by weight, and more preferably 1 to 10 parts by weight per 100 parts by weight of components (A) and (B) combined. Within the range, sufficient condensation cure is exerted.

Component (C) plays the role of promoting condensation cure reaction. Now that component (C) is included in the silicone resin composition, fast condensation cure reaction takes place without a need for condensation catalysts. This prevents or retards the cured composition from being colored or degraded. The composition is thus best suited as an encapsulant for light-emitting devices.

Component (D)

Component (D) is a hydrosilylation catalyst. The catalyst is not particularly limited and may be selected from well-known ones. Preferred are platinum group metal elements and platinum group metal compounds. Suitable catalysts include platinum base catalysts such as platinum (inclusive of platinum black), platinum chloride, chloroplatinic acid, platinum-olefin complexes such as platinum-divinylsiloxane complex, and platinum-carbonyl complexes, palladium base catalysts and rhodium base catalysts. These catalysts may be used alone or in admixture. Inter alia, chloroplatinic acid and platinum-olefin complexes such as platinum-divinylsiloxane complex are preferred.

The amount of component (D) used is not particularly limited and may be a catalytic amount. The catalytic amount is a sufficient amount for addition reaction to take place and may be determined as appropriate in accordance with the desired cure rate. In an example where the platinum group metal compound is used, it is preferred from the standpoint of reaction rate that the catalyst be used in such an amount as to provide 0.5 to 10 ppm, more preferably 1 to 5 ppm of platinum group metal based on the total weight of components (A), (B) and (C).

The invention provides a silicone resin sheet of the addition/condensation curable silicone resin composition defined above which in the uncured state, is plastic and solid or semisolid at normal temperature. The term "normal temperature" indicates an ambient temperature in normal conditions, specifically a temperature of 24±2° C. (i.e., 22 to 26° C.). The term "semisolid" refers to a state of material that is plastic and when molded into a specific shape, can retain the shape for at least 1 hour, preferably at least 8 hours. With respect to a fluid material having a very high viscosity at normal temperature, for example, that material is regarded semisolid when any change (collapse) of the endowed shape is not observed to naked eyes within a short time of at least 1 hour due to the very high viscosity, despite its essential fluidity.

In a preferred embodiment, (E) a phosphor is incorporated in the silicone resin composition.

Component (E)

Component (E) is a phosphor. The phosphor is not particularly limited and any well-known phosphors may be used. When added, the amount of the phosphor is typically 0.1 to 1,000 parts, preferably 10 to 500 parts by weight per 100 parts by weight of components (A) to (C) combined. When the phosphor is incorporated into the silicone resin sheet, the sheet advantageously serves as a wavelength conversion sheet. This wavelength conversion sheet exerts stable performance because it is solid or semisolid at normal temperature, and the phosphor is uniformly dispersed therein and remains stable with a lapse of time.

The phosphor takes the form of particles having a particle diameter of typically 0.01 to 100 µm, preferably 0.1 to 80 µm, and more preferably 0.5 to 50 µm, as measured by a particle size distribution measurement system CILAS using the laser light diffraction method. The average particle size is preferably 1 to 50 µm, more preferably 3 to 20 µm. The average particle size is a weight average value D50 (or median diameter) in the particle size distribution as measured by a laser diffractometry particle size distribution measurement system.

One preferred example is the phosphor capable of absorbing light from a semiconductor chip, typically a semiconductor LED including a light-emissive layer of nitride semiconductor and converting it to light of different wavelength. Suitable such phosphors include nitride base phosphors and oxynitride base phosphors which are activated mainly with a lanthanoid element such as Eu or Ce; alkaline earth metal halide apatite phosphors which are activated mainly with a lanthanoid element such as Eu or a transition metal element such as Mn, alkaline earth metal borate halide phosphors, alkaline earth metal aluminate phosphors, alkaline earth metal silicate phosphors, alkaline earth metal sulfide phosphors, alkaline earth metal thiogallate phosphors, alkaline earth metal silicon nitride phosphors, and germanate phosphors; rare earth aluminate phosphors which are activated mainly with a lanthanoid element such as Ce; rare earth silicate phosphors; organic and organic complex phosphors which are activated mainly with a lanthanoid element such as Eu; and Ca—Al—Si—O—N oxynitride glass phosphors, which may be used alone or in admixture. In the description of phosphors below, M is at least one element selected from Sr, Ca, Ba, Mg, and Zn; X is at least one element selected from F, Cl, Br and I; and R is Eu, Mn, or a combination of Eu and Mn.

Exemplary of the nitride phosphors which are activated mainly with a lanthanoid element such as Eu or Ce are $M_2Si_5N_8$:Eu. Also included are $MSi_7N_{10}$:Eu, $M_{1.8}Si_5O_{0.2}N_8$:Eu, and $M_{0.9}Si_7O_{0.1}N_{10}$:Eu.

Exemplary of the oxynitride phosphors which are activated mainly with a lanthanoid element such as Eu or Ce are $MSi_2O_2N_2$:Eu Exemplary of the alkaline earth metal halide apatite phosphors which are activated mainly with a lanthanoid element such as Eu or a transition metal element such as Mn are $M_5(PO_4)_3X$:R.

Exemplary of the alkaline earth metal borate halide phosphors are $M_2B_5O_9X$:R.

Exemplary of the alkaline earth metal aluminate phosphors are $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R and $BaMgAl_{10}O_{17}$:R.

Exemplary of the alkaline earth metal sulfide phosphors are $La_2O_2S$:Eu, $Y_2O_2S$:Eu and $Gd_2O_2S$:Eu.

Exemplary of the rare earth aluminate phosphors which are activated mainly with a lanthanoid element such as Ce are YAG base phosphors of the compositional formulae: $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y,Gd)_3(Al,Ga)_5O_{12}$:Ce. Also included are variants of the foregoing wherein Y is partly or entirely replaced by Tb or Lu, such as $Tb_3Al_5O_{12}$:Ce and $Lu_3Al_5O_{12}$:Ce.

Other suitable phosphors include ZnS:Eu, $Zn_2GeO_4$:Mn, and $MGa_2S_4$:Eu.

In the above phosphors, at least one element selected from Tb, Cu, Ag, Au, Cr, Nd, Dy, Co, Ni and Ti may be incorporated instead of Eu or in addition to Eu, if desired.

The Ca—Al—Si—O—N oxynitride glass phosphors are phosphors based on an oxynitride glass matrix consisting of 20 to 50 mol % of $CaCO_3$ (calculated as CaO), 0 to 30 mol % of $Al_2O_3$, 25 to 60 mol % of $SiO$, 5 to 50 mol % of AlN, and 0.1 to 20 mol % of a rare earth oxide or transition metal oxide, the total of five ingredients being 100 mol %. In the phosphors based on an oxynitride glass matrix, the nitrogen content is preferably up to 15 mol %, and besides the rare earth oxide ion, another rare earth ion serving as a sensitizer is preferably contained in the phosphor glass in a content of 0.1 to 10 mol % of rare earth oxide as a co-activator.

Phosphors other than the foregoing may also be used as long as they have equivalent functions and effects.

Other Components

In addition to the above components (A) to (E), the composition or sheet may include optional additives as long as the benefits of the invention are not impaired. These additives are described below.

Inorganic Filler

An inorganic filler may be incorporated in the composition or sheet. The inorganic filler is effective for adjusting light scattering of the cured product and the flow of the composition and increasing the strength of the sheet. The inorganic filler preferably takes the form of ultrafine particles which do not adversely affect optical properties, but is not limited thereto. Suitable inorganic fillers include reinforcing fillers such as fumed silica, fumed titanium dioxide, fumed alumina, and non-reinforcing fillers such as calcium carbonate, calcium silicate, titanium dioxide, ferric oxide, carbon black and zinc oxide, which may be used alone or in admixture. When added, the total amount of the inorganic filler may be up to 600 parts by weight (0 to 600 parts) per 100 parts by weight of components (A) to (C) combined.

Reactive Liquid Silicone

A reactive liquid silicone may be incorporated in the silicone resin composition or sheet as long as the sheet remains solid or semisolid and does not become liquid at normal temperature. The liquid silicone used herein should preferably have a viscosity of about 1 to about 100,000 mPa·s at 25° C. as measured by a rotational viscometer. Examples include vinylsiloxanes, hydrogensiloxanes, alkoxysiloxanes, hydroxysiloxanes, and mixtures thereof. The amount of the liquid silicone added should be such that the sheet remains solid or semisolid at normal temperature, and is typically up to 50% by weight of the overall silicone resin sheet.

Other Additives

Besides the above components, other additives may be added to the composition or sheet. Suitable additives include an antioxidant, photostabilizer, shelf stability improver, heat stabilizer, flame retardant, physical property regulator, pH regulator, surfactant, thickener, plasticizer, coupling agent, conductive agent, antistatic agent, metal inactivating agent, nucleating agent, lubricant, pigment, etc. These optional additives may be used alone or in admixture.

The addition/condensation curable silicone resin sheet should preferably be free of a condensation catalyst. This eliminates the problem that the resin can be colored and that the hydrosilylation catalyst can be degraded by the condensation catalyst, and allows the cured sheet to exert high heat resistance and light resistance which are inherent to silicone resins. Nevertheless, it is acceptable to add a limited amount of condensation catalyst to the composition or sheet.

The simplest embodiment of the silicone resin composition is a composition consisting essentially of components (A) to (D) and being free of an inorganic filler.

Preparation of Composition

The silicone resin composition may be prepared by melt mixing components (A) to (D) and optional components on a hot roll mill, kneader or extruder, cooling the melt for solidification, and grinding to a suitable size, thereby yielding a solventless molding compound. Alternatively, selected components are dissolved in a suitable solvent and uniformly mixed to form a varnish, from which the solvent is volatilized off. Examples of the solvent used to form varnish include, but are not limited to, hydrocarbon solvents such as benzene, toluene and xylene; ether solvents such as tetrahydrofuran, 1,4-dioxane, diethyl ether, diglyme, and triglyme; ketone solvents such as methyl ethyl ketone and cyclohexanone; halogen solvents such as chloroform, methylene chloride, and 1,2-dichloroethane; alcohol solvents such as methanol, ethanol, isopropyl alcohol, isobutyl alcohol and cyclohexanol; non-reactive volatile short-chain siloxane solvents such as octamethylcyclotetrasiloxane and hexamethyldisiloxane; cellosolve solvents such as cellosolve acetate and butyrocellosolve; and carbitol solvents such as methylcarbitol, carbitol, butylcarbitol, and diethylcarbitol. Inter alia, toluene, xylene, diglyme and cyclohexanone are preferred. The organic solvents may be used alone or in admixture.

Preparation of Sheet

The solventless silicone resin composition may be shaped into a sheet using a hot press or shaping machine. Alternatively, the composition is dissolved in a suitable solvent to form a varnish. The varnish is cast into a concave mold or applied to a suitable substrate before the solvent is volatilized off, yielding a sheet.

B Stage of Composition

The silicone resin composition may be B-staged prior to complete cure for the purpose of adjusting the hardness and softening point of the sheet. For example, once a composition is prepared from components (A) to (E) as mentioned above, it is moderately heated to promote cure reaction until a molecular weight buildup or B-stage is reached. The heating step may be done in the solvent or after sheet formation. The heating conditions for B-staging reaction include preferably a temperature of 50 to 200° C., more preferably 60 to 180° C., and even more preferably 70 to 150° C. and a time of 1 to 72 hours, more preferably 2 to 48 hours, and even more preferably 3 to 24 hours. After B-staging, the overall composition preferably has a molecular weight (Mw) of 10,000 to 1,000,000. An alternative method is possible involving the steps of premixing components (A) to (C) and an optional solvent, heating the premix to induce condensation reaction to achieve a molecular weight buildup, adding the hydrosilylation catalyst (D) and phosphor (E) to the mix, and shaping the mix into a sheet.

Curing of Resin Sheet

Once the silicone resin sheet is prepared as above, it is heat cured at a necessary time, yielding a flexible cured sheet having a high hardness and a tack-free surface.

The resin sheet may be cured, for example, by heating at 60 to 180° C. for 1 to 24 hours. Preferably the sheet is cured stepwise in a range from 25° C. to 180° C. The stepwise curing includes two, three or more steps, for example, preferably three steps. Specifically the sheet is cured at a low temperature of 25 to 60° C. for about 0.5 to 2 hours, heat cured at 60 to 120° C. for about 0.5 to 2 hours, and finally heat cured at 150 to 180° C. for about 1 to 10 hours. More specifically and preferably, the resin sheet is low-temperature cured at 60° C. for 1 hour, heat cured at 100° C. for 1 to 2 hours, and finally heat cured at 150° C. for 3 to 8 hours. Such stepwise curing ensures full cure into a colorless transparent sheet even when the sheet is thick.

Manufacture of Light-Emitting Package

According to the invention, a light-emitting package is manufactured by placing the green silicone resin sheet or the wavelength conversion sheet (i.e., the silicone resin sheet having further incorporated therein the phosphor) on an LED chip, and heat curing the sheet to encapsulate the LED chip on its surface with the cured silicone resin layer or phosphor-containing cured silicone resin layer. The light-emitting package comprising the encapsulated LED chip is also contemplated herein.

The silicone resin sheet is suited for the encapsulation of LED chips, especially blue and ultraviolet LED chips. A light-emitting package may be constructed by placing the green resin sheet on an LED chip, typically press bonding, and heat curing the sheet, thereby forming a cured coating on the LED chip. In this way, a phosphor-containing layer capable of stable light conversion is formed on the surface of the LED chip. The phosphor-containing layer is hard, but flexible and has a substantially tack-free surface.

The silicone resin sheet typically has a thickness of 1 to 500 μm, preferably 10 to 300 μm although the thickness may vary depending on the phosphor content, emission efficiency and the like. The size of the silicone resin sheet may be determined in proportion to the size of an LED chip. The sheet is placed on the surface of the LED chip and heat cured thereto. The heat curing may be performed under the above-mentioned conditions and typically include primary and secondary curing steps.

Typically the sheet is press bonded to the LED chip at a temperature of room temperature to 300° C. and a pressure of up to 10 MPa (e.g., 0.01 to 10 MPa), preferably up to 5 MPa (e.g., 0.1 to 5 MPa), and more preferably 0.5 to 5 MPa.

The addition/condensation curable silicone resin sheet is easy to handle because it is solid or semisolid at normal temperature, and is industrially advantageous because it may be briefly cured even in the absence of a condensation catalyst. By virtue of satisfactory heat resistance and light resistance, the cured silicone resin sheet is quite useful in the application exposed to severe environments, typically as encapsulant for semiconductor devices, LED and solar cells.

EXAMPLE

Examples of the invention are given below by way of illustration and not by way of limitation. In Examples, all parts are by weight (pbw) unless otherwise indicated. The weight average molecular weight (Mw) is measured by GPC versus polystyrene standards under the above-mentioned conditions. The average particle size is a weight average value D50 (or median diameter) as measured by a laser diffractometry particle size distribution measurement system. Substances used as components (A) to (E) are identified below. Vi stands for vinyl.

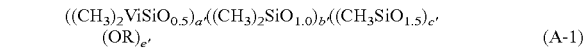
(A-1)

$a'=998$, $b'=3{,}010$, $c'=9{,}020$, $e'=256$,

Mw=936,050, R=H or CH(CH$_3$)$_2$, vinyl value=0.11 mol/100 g

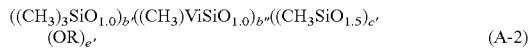
(A-2)

b'=10,500, b''=502, c'=2,490, e'=25,
Mw=989,130, R=H or CH$_2$CH$_3$, vinyl value=0.051 mol/100 g

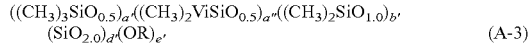
(A-3)

a'=3,450, a''=1,510, b'=2,040, d'=4,010, e'=338,
Mw=832,100, R=H or CH(CH$_3$)$_2$, vinyl value=0.18 mol/100 g

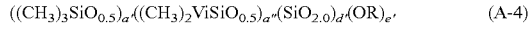
(A-4)

a'=1,000, a''=2,990, d'=9,020, e'=253,
Mw=887,969, R=H or CH$_2$CH$_3$, vinyl value=0.11 mol/100 g

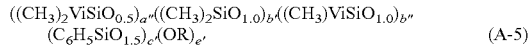
(A-5)

a''=5, b'=30, b''=5, c'=99, e'=19,
Mw=16,373, R=H, vinyl value=0.062 mol/100 g

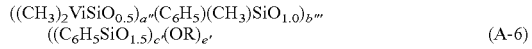
(A-6)

a''=5, b'''=20, c'=101, e'=20,
Mw=16,584, R=H, vinyl value=0.031 mol/100 g

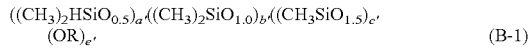
(B-1)

a'=1,005, b'=2,990, c'=9,010, e'=238,
Mw=907,036, R=H or CH(CH$_3$)$_2$, H value=0.11 mol/100 g

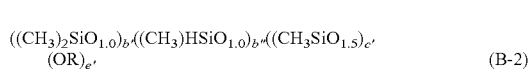
(B-2)

b'=10,490, b''=505, c'=2,500, e'=24,
Mw=976,120, R=H or CH$_2$CH$_3$, H value=0.052 mol./100 g

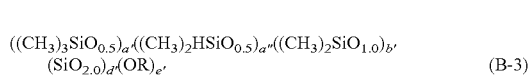
(B-3)

a'=3,440, a''=1,520, b'=2,010, d'=4,020, e'=316,
Mw=790,546, R=H or CH(CH$_3$)$_2$, H value=0.19 mol/100 g

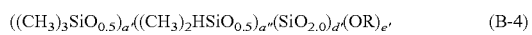
(B-4)

a'=1,020, a''=3,010, d'=8,970, e'=261,
Mw=863,258, R=H or CH$_2$CH$_3$, H value=0.12 mol/100 g

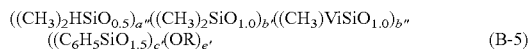
(B-5)

a''=5, b'=31, b''=5, c'=100, e'=21,
Mw=16,470, R=H, H value=0.062 mol/100 g

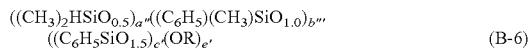
(B-6)

a''=6, b'''=20, c'=100, e'=20,
Mw=16,682, R=H, H value=0.037 mol/100 g

(C-1)

f=2, Mw=270, R'=CH$_2$CH$_3$

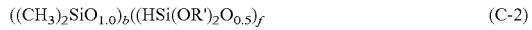
(C-2)

b=80, f=2, Mw=6,224, R'=CH$_3$

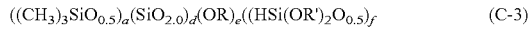
(C-3)

a=46, d=70, e=14, f=10,
Mw=9,930, R=CH(CH$_3$)$_2$, R'=CH$_3$

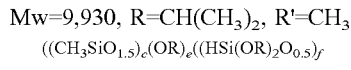
(C-4)

c=72, e=8, f=5, Mw=5,732, R=CH$_3$, R'=CH$_2$CH$_3$

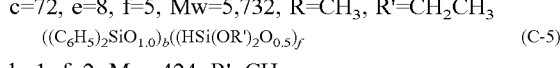
(C-5)

b=1, f=2, Mw=424, R'=CH$_3$

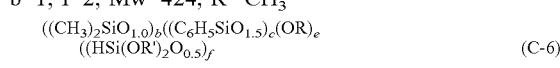
(C-6)

b=20, c=48, e=3, f=7, Mw=8,506, R=H, R'=CH$_3$ (D) Divinyl siloxane complex of chloroplatinic acid (Shin-Etsu Chemical Co., Ltd.)

(D') Condensation catalyst Orgatix TC-750 (Matsumoto Fine Chemical Co., Ltd., Ti content 11.2 wt %)

(E) Phosphor NYAG 4454L (Intematix Corp., D50=12.8 μm)

Examples 1 to 7 & 10

A xylene solution of resin composition was prepared by weighing the amounts (described in Table 1) of components (A), (B) and (C), dissolving them in xylene, the amount of xylene being 20 wt % based on the total weight of components (A), (B) and (C), adding component (D) in such an amount to provide 2 ppm of Pt based on the total weight of components (A), (B) and (C), and further mixing. The silicone compositions of Examples 1 to 7 and 10 were examined by the following tests. In Table 1, the value of H/Vi is a ratio of the total number of hydrosilyl groups in component (B) to the total number of vinyl groups in component (A).

Example 8

100 parts of component (A-5), 100 parts of component (B-5), and 6 parts of component (C-5) were dissolved in 51.5 parts of xylene. The solution was heated at 100° C. for 3 hours for condensation reaction. The resulting organopolysiloxane had a molecular weight of 256,230. To the xylene solution of the organopolysiloxane at 25° C., component (D) was added in such an amount to provide 2 ppm of Pt based on the total weight of components (A), (B) and (C). By further mixing, a xylene solution of resin composition was obtained. The silicone composition was examined by the following tests.

Example 9

On a co-kneader (Buss AG), 100 parts of component (A-5) and 100 parts of component (B-5) were mixed below 60° C. until uniform. Further, 6 parts of component (C-5) and such an amount of component (D) as to provide 2 ppm of Pt based on the total weight of components (A), (B) and (C) were added and uniformly mixed, yielding a resin composition. The resin composition was cooled at −60° C. and finely ground. The powder was examined by the following tests.

Comparative Examples 1 to 6

As in Examples 1 to 7 and 10, a xylene solution of resin composition was prepared by dissolving components (A) and (B) in xylene, the amount of xylene being 20 wt % based on the total weight of components (A) and (B), and adding component (D) in such an amount to provide a Pt content (Table 1) based on the total weight of components (A) and (B). The same tests were performed.

Comparative Example 7

As in Examples 1 to 7 and 10, a xylene solution of resin composition was prepared by dissolving components (A)

and (B) in xylene, the amount of xylene being 20 wt % based on the total weight of components (A) and (B), and adding component (D') in such an amount to provide 20 ppm of Ti based on the total weight of components (A) and (B). The same tests were performed.

(1) Preparation of Sheet

The resin solution was cast into a tetrafluoroethylene mold of 10 cm×10 cm×0.1 μm (thick) and adjusted to a uniform thickness by means of a squeegee. The xylene was volatilized off by heating at 60° C. for 1 hour, yielding a resin sheet. The resin powder of Example 9 was packed in a tetrafluoroethylene mold of 10 cm×10 cm×0.1 μm (thick) and hot pressed at 80° C., yielding a resin sheet. The green sheets thus obtained were rested on a horizontal base at 25° C. for 8 hours, after which any dimensional change was inspected, and further rested at 25° C. for 1 week, after which any dimensional change was inspected again. The sample was regarded solid when no dimensional change was observed after 1 week, and semisolid when no dimensional change was observed after 8 hours, but a dimensional change was observed after 1 week. The results are shown in Table 2.

(2) Gel Fraction

For the purpose of evaluating the curability (or curing rate) of the sheet, a gel fraction was measured. The green sheet in (1) was heat cured at 150° C. for 30 minutes. A portion (~1 g) of the cured sheet was fully immersed in 20 g of acetone and kept therein at 25° C. for 3 hours. Acetone was removed by filtration, the cured sheet residue on the filter was fully dried and weighed. A gel fraction was computed by dividing the weight of the sheet after acetone immersion by the weight of the sheet prior to the immersion. A percent gel fraction is reported in Table 2.

(3) Hardness of Cured Sheet

The green sheet in (1), about 2 g, was folded and packed in a tetrafluoroethylene mold of 2 cm×2 cm×3 mm (thick) and compression molded by means of a hot press at 150° C. for 5 minutes. The molded product was heat cured at 150° C. for 6 hours. The cured product was measured for Durometer Type A or D hardness according to JIS K 6253-3:2012. The results are shown in Table 2.

(4) Tensile Strength and Elongation at Break of Cured Sheet

The green sheet in (1) was measured for tensile strength and elongation at break on a tensile tester EZ TEST (EZ-L by Shimadzu Corp.) according to JIS K 6251:2010 under conditions including a separation rate of 500 mm/min, a distance between grips of 80 mm, and a distance between two gage marks of 40 mm. The results are shown in Table 2.

(5) Light Transmittance

On a slide glass plate of 26 mm×76 mm×1 mm (thick), seven tetrafluoroethylene tape strips of 0.18 mm thick were piled up to form a concave dam of 1.26 mm high. The resin solution was cast into the cavity and adjusted to a uniform thickness by means of a squeegee. Xylene was volatilized off by heating at 60° C. for 1 hour. The resin was heat cured at 150° C. for 6 hours, yielding a cured product of 1 mm thick. In the case of the resin powder of Example 9, a slide glass plate of 26 mm×76 mm×1 mm (thick) was placed in a tetrafluoroethylene mold of 10 cm×10 cm×2 mm (thick), the powder was packed in the mold, and compression molded by means of a hot press at 150° C. for 5 minutes, and heat cured at 150° C. for 6 hours, yielding a cured product of 1 mm thick. The cured sample was measured for light transmittance at wavelength 450 nm on a spectrometer U-4100 (Hitachi High-Technologies Corp.). The results are shown in Table 2.

(6) Heat Resistance

The sample for transmittance measurement obtained in (5) was allowed to stand at 200° C. for 1,000 hours, before it was measured for light transmittance at 450 nm, from which a degree of yellowing of the resin was evaluated. The sample was also visually observed to examine whether or not the resin cracked. The results are shown in Table 2.

(7) Surface Tack

The green sheet in (1) was heat cured at 150° C. for 6 hours, commercially available silver powder (average particle size 5 μm) was spread on the cured sheet, and the sheet was taken out. By blowing air to the sheet surface on which silver particles were deposited like dust, it was examined whether or not silver particles were blown off. The sample is regarded tack-free when no silver particles were left behind.

Examples 11 to 13 and Comparative Examples 8 to 11

A resin solution was prepared by dissolving the amounts (shown in Table 1) of components (A), (B), (C) and (D) or (D') in xylene, the amount of xylene being 20 wt % based on the total weight of components (A) to (D), and uniformly mixing them. The amount (shown in Table 1) of a phosphor as component (E) was mixed with the resin solution.

(8) Preparation of Wavelength Conversion Sheet

As in (1), the resin solution was cast into a tetrafluoroethylene mold of 10 cm×10 cm×0.1 μm (thick) and adjusted to a uniform thickness by means of a squeegee. The xylene was volatilized off by heating at 60° C. for 1 hour, yielding a phosphor-containing resin sheet or wavelength conversion sheet.

(9) Lighting Test

An LED lighting test was carried out to evaluate the heat resistance and light resistance of the wavelength conversion sheet. An LED flip chip (B4545FCM1, GeneLite Inc.) for 450 nm light emission was mounted to gold electrodes on a ceramic substrate by solder bonding. Using a compression vacuum laminator (V130, Nikko Material Co., Ltd.), the green sheet in (1) was laminated thereto (laminating temperature 80° C., vacuuming time 60 seconds). The sheet was heat cured at 150° C. for 6 hours, completing an LED lighting package. Using a spectrometer LE-5400 (Otsuka Electronics Co., Ltd.), the LED lighting package was measured for chromaticity (u', v'). Next, the LED lighting package was placed in an oven at 150° C. and lit at 1.4 A for 1,000 hours, after which it was measured for chromaticity (u', v') again. Provided that the initial chromaticity is 0, a shift of chromaticity after 1,000 hours of lighting is reported in Table 3.

Also, while the LED lighting package was lit at 1.4 A, a thermal cycling test (TCT) between −40° C. and 125° C. over 1,000 cycles was carried out. A shift of chromaticity after the TCT is also reported in Table 3. A larger value of color shift indicates an undesirable extent of coloring, resin cracking, or separation from substrate.

TABLE 1

| Blending amount (pbw) | Example | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| (A-1) | 100 | 100 | | | | | | | | | | | |
| (A-2) | | | 100 | 100 | | | | | | | | | |
| (A-3) | | | | | 100 | | | | | | | | |
| (A-4) | | | | | | 100 | | | | | | | |
| (A-5) | | | | | | | 100 | 100 | 100 | | 100 | 100 | 100 |
| (A-6) | | | | | | | | | | 100 | | | |
| (B-1) | 100 | 50 | | | | | | | | | | | |
| (B-2) | | | 350 | | | 100 | | | | | | | |
| (B-3) | | | | | 100 | | | | | | | | |
| (B-4) | | | | 50 | | | | | | | | | |
| (B-5) | | | | | | | 100 | 100 | 100 | | 100 | 100 | 100 |
| (B-6) | | | | | | | | | | 100 | | | |
| H/Vi | 1.0 | 0.5 | 3.6 | 1.2 | 1.1 | 2.1 | 1.0 | 1.0 | 1.0 | 1.2 | 1.0 | 1.0 | 1.0 |
| (C-1) | 0.5 | 2 | | | | | | | | | | | |
| (C-2) | | | | 40 | 20 | | | | | | | | |
| (C-3) | | | 7.5 | | | | | | | | | | |
| (C-4) | | | 45 | | | | | | | | | | |
| (C-5) | | | | | | | 6 | 6 | 6 | | 6 | 6 | 6 |
| (C-6) | | | | | | | | | | 12 | | | |
| (D) [ppm] | 2 | 2 | 2 | 2 | 2 | 2 | 2 | 2 | 2 | 2 | 2 | 2 | 2 |
| (D') [ppm] | | | | | | | | | | | | | |
| (E) | | | | | | | | | | | 10 | 400 | 900 |

| Blending amount (pbw) | Comparative Example | | | | | | | | | | |
|---|---|---|---|---|---|---|---|---|---|---|---|
| | 1 | 2 | 3 | 4 | 5 | 6 | 7 | 8 | 9 | 10 | 11 |
| (A-1) | 100 | 100 | | | | | | | | | |
| (A-2) | | | | | | | | | | | |
| (A-3) | | | | | | | | | | | |
| (A-4) | | | | | | | | | | | |
| (A-5) | | | 100 | 100 | 100 | 100 | 100 | 100 | 100 | 100 | 100 |
| (A-6) | | | | | | | | | | | |
| (B-1) | 100 | 100 | | | | | | | | | |
| (B-2) | | | | | | | | | | | |
| (B-3) | | | | | | | | | | | |
| (B-4) | | | | | | | | | | | |
| (B-5) | | | 100 | 100 | 100 | 100 | 100 | 100 | 100 | 100 | 100 |
| (B-6) | | | | | | | | | | | |
| H/Vi | 1.0 | 1.0 | 1.0 | 1.0 | 1.0 | 1.0 | 1.0 | 1.0 | 1.0 | 1.0 | 1.0 |
| (C-1) | | | | | | | | | | | |
| (C-2) | | | | | | | | | | | |
| (C-3) | | | | | | | | | | | |
| (C-4) | | | | | | | | | | | |
| (C-5) | | | | | | | | | | | |
| (C-6) | | | | | | | | | | | |
| (D) [ppm] | 2 | 15 | 2 | 15 | 20 | | | 15 | 15 | 15 | |
| (D') [ppm] | | | | | | | 20 | | | | 20 |
| (E) | | | | | | 10 | 400 | 900 | | | 400 |

TABLE 2

| Physical properties | Example | | | | | | | | | |
|---|---|---|---|---|---|---|---|---|---|---|
| | 1 | 2 | 3 | 4 | 5 | 6 | 7 | 8 | 9 | 10 |
| State (uncured) | solid | solid | semi-solid | solid | solid | solid | solid | solid | solid | solid |
| Gel fraction, % | 90 | 88 | 86 | 90 | 87 | 89 | 89 | 91 | 90 | 86 |
| Hardness, Shore A | 87 | 81 | 50 | 80 | 85 | 76 | 85 | 86 | 87 | 82 |
| Tensile strength, MPa | 8.8 | 8.1 | 3.6 | 7.4 | 8.5 | 7.1 | 4.8 | 4.9 | 4.8 | 3.9 |
| Elongation at break, % | 50 | 45 | 80 | 50 | 40 | 55 | 70 | 70 | 70 | 90 |
| Light transmittance @450 nm, % T | 99.6 | 99.5 | 99.7 | 99.6 | 99.6 | 99.7 | 99.4 | 99.5 | 99.5 | 99.4 |
| Heat resistance (transmittance after 200° C./1,000 hr) | 99.6 | 99.5 | 99.6 | 99.6 | 99.5 | 99.7 | 98.9 | 99 | 98.9 | 98.5 |
| Heat resistance (resin cracking after 200° C./1,000 hr) | no | no | no | no | no | no | no | no | no | no |

TABLE 2-continued

| Ag powder deposit test (surface tack) | no deposit | no deposit | no deposit | no deposit | no deposit | no deposit | no deposit | no deposit | no deposit | no deposit |

| | Comparative Example | | | | | | |
|---|---|---|---|---|---|---|---|
| Physical properties | 1 | 2 | 3 | 4 | 5 | 6 | 7 |
| State (uncured) | solid | solid | solid | solid | solid | solid | solid |
| Gel fraction, % | 67 | 88 | 54 | 82 | 89 | resin was not cured, but melted | 42 |
| Hardness, Shore A | 77 | 86 | 46 | 85 | 86 | | 35 |
| Tensile strength, MPa | 6.4 | 8.8 | 1.6 | 4.2 | 4.8 | | 0.9 |
| Elongation at break, % | 90 | 50 | 100 | 80 | 70 | | 120 |
| Light transmittance @450 nm, % T | 99.5 | 99.6 | 99.4 | 99.3 | 99.4 | | 99.4 |
| Heat resistance (transmittance after 200° C./1,000 hr) | 99.4 | 98.9 | 98.8 | 88.2 | 82.4 | | 84.4 |
| Heat resistance (resin cracking after 200° C./1,000 hr) | no | cracked | no | cracked | cracked | | cracked |
| Ag powder deposit test (surface tack) | no deposit | no deposit | no deposit | no deposit | no deposit | | no deposit |

TABLE 3

| | Example | | | Comparative Example | | | |
|---|---|---|---|---|---|---|---|
| Heat/light resistance | 11 | 12 | 13 | 8 | 9 | 10 | 11 |
| Color shift (u'v') after 150° C./1.4 A/1,000 hr lighting test | 0.0048 | 0.0027 | 0.0017 | 0.0141 | 0.0108 | 0.0079 | 0.0146 |
| Color shift (u'v') after 1.4 A lighting and TCT −40° C. ⇔ 125° C., 1,000 cycles | 0.0060 | 0.0039 | 0.0031 | 0.0184 | 0.0137 | 0.0109 | 0.0191 |

INDUSTRIAL APPLICABILITY

The silicone resin sheet of the invention is easy to handle, effective to cure, and likely to form a cured layer around an LED chip. Because of excellent cured properties including heat resistance, UV resistance, transparency, toughness and adhesion, the sheet is best suited for the encapsulation of LED chips.

Japanese Patent Application No. 2015-207806 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An addition/condensation curable silicone resin sheet comprising
   (A) an organopolysiloxane containing at least two silicon-bonded alkenyl groups and at least two silicon-bonded alkoxy or hydroxyl groups in the molecule, represented by the formula (1):

$$(R^1{}_3SiO_{1/2})_{a'}(R^1{}_2SiO_{2/2})_{b'}(R^1SiO_{3/2})_{c'}(SiO_{4/2})_{d'}(OR^2)_{e'} \quad (1)$$

wherein $R^1$ is a $C_1$-$C_6$ monovalent aliphatic saturated hydrocarbon group, $C_2$-$C_6$ alkenyl group or $C_6$-$C_{12}$ monovalent aromatic hydrocarbon group, at least two $R^1$ being alkenyl, $R^2$ is hydrogen or $C_1$-$C_6$ alkyl or alkoxyalkyl group, a', b', c', and d' each are an integer of at least 0, c'+d' is an integer of at least 1, and e' is an integer of at least 2, the organopoly-siloxane (A) being solid or semisolid at normal temperature and having a weight average molecular weight of 1,000 to 1,200,000 as measured versus polystyrene standards by gel permeation chromatography, (B) an organopolysiloxane containing at least two silicon-bonded hydrogen atoms and at least two silicon-bonded alkoxy or hydroxyl groups in the molecule, represented by the formula (2):

$$(R^3{}_3SiO_{1/2})_{a''}(R^3{}_2SiO_{2/2})_{b''}(R^3SiO_{3/2})_{c''}(SiO_{4/2})_{d''}(OR^2)_{e''} \quad (2)$$

wherein $R^3$ is hydrogen, a $C_1$-$C_6$ monovalent aliphatic saturated hydrocarbon group, or $C_6$-$C_{12}$ monovalent aromatic hydrocarbon group, at least two $R^3$ being hydrogen, $R^2$ is as defined above, a", b", c", and d" each are an integer of at least 0, c"+d" is an integer of at least 1, and e" is an integer of at least 2, the organopolysiloxane (B) being solid or semisolid at normal temperature and having a weight average molecular weight of 1,000 to 1,200,000 as measured versus polystyrene standards by gel permeation chromatography, in an amount to give a ratio of the number of silicon-bonded hydrogen atoms to the total number of alkenyl groups in component (A) in a range of 0.4/1 to 4.0/1, (C) an organopolysiloxane containing at least two silicon atoms having two alkoxy or hydroxyl groups and one hydrogen atom on a common silicon atom in the molecule, represented by the formula (3):

$$(R^3{}_3SiO_{1/2})_{a'''}(R^3{}_2SiO_{2/2})_{b'''}(R^3SiO_{3/2})_{c'''}(SiO_{4/2})_{d'''}(OR^2)_{e'''}(HSi(OR^2)_2O_{1/2})_f \quad (3)$$

wherein $R^2$ and $R^3$ are as defined above, a''', b''', c''', d''' and e''' each are an integer of at least 0, and f is an integer of at least 2, the organopolysiloxane (C) having a weight average molecular weight of 150 to 10,000 as measured versus polystyrene standards by gel permeation chromatography, in an amount of 0.1 to 20 parts by weight per 100 parts by weight of components (A) and (B) combined, and
  (D) a catalytic amount of a hydrosilylation catalyst, the sheet being plastic and solid or semisolid at normal temperature.

2. The resin sheet of claim 1 wherein the hydrosilylation catalyst (D) is present in an amount of 0.5 to 10 ppm based on the total weight of components (A), (B) and (C).

3. The resin sheet of claim 1 which is free of a condensation catalyst.

4. A wavelength conversion sheet in the form of the silicone resin sheet of claim 1, the sheet further comprising (E) 0.1 to 1,000 parts by weight of a phosphor per 100 parts by weight of components (A), (B) and (C) combined.

5. A method for manufacturing a light-emitting package, comprising the steps of placing the silicone resin sheet of claim 1 on an LED chip mounted in a light-emitting device, and heat curing the sheet to encapsulate the LED chip.

6. A method for manufacturing a light-emitting package, comprising the steps of placing the wavelength conversion sheet of claim 4 on an LED chip mounted in a light-emitting device, and heat curing the sheet to encapsulate the LED chip.

* * * * *